United States Patent [19]
Bayati

[11] 3,778,812
[45] Dec. 11, 1973

[54] METHOD AND APPARATUS FOR ANALOG-DIGITAL CONVERSION

[75] Inventor: Abutorab Bayati, Neureut, Germany

[73] Assignee: Siemens Aktiengesellschaft, Munich, Germany

[22] Filed: Mar. 17, 1971

[21] Appl. No.: 125,431

Related U.S. Application Data

[63] Continuation of Ser. No. 730,067, May 17, 1968, abandoned.

[52] U.S. Cl... 340/347 NT, 340/347 AD, 324/99 D, 235/183

[51] Int. Cl. .......................................... H03k 13/20

[58] Field of Search........................ 340/347; 324/99, 324/103; 235/183, 92

[56] References Cited

UNITED STATES PATENTS

| | | | |
|---|---|---|---|
| 3,296,613 | 1/1967 | Andersen et al. | 340/347 NT |
| 3,267,458 | 8/1966 | Anderson et al. | 340/347 |
| 3,480,948 | 11/1969 | Lord | 340/347 |
| 3,439,271 | 4/1969 | Metcalf et al. | 324/99 |
| 3,525,093 | 8/1970 | Marshall | 340/347 |
| 3,337,722 | 8/1967 | Siess et al. | 235/92 |

*Primary Examiner*—Charles D. Miller
*Attorney*—Edwin E. Greigg

[57] ABSTRACT

A process and apparatus for analog-to-digital conversion includes a storage circuit (SP) having a capacitor which is charged to a value corresponding to the voltage of an input analog signal (I). The change in charge of the capacitor is thereafter measured in terms of a time interval including at least two steps by counting pulses applied to a bidirectional counter during the discharge of the capacitor. The discharge rate employed in subsequent steps of the process is lower than the discharge rate used in the initial step. During the initial step, current from a source ($S_1$) is applied to the storage circuit (SP) at a higher rate than in the second subsequent step during which the storage circuit (SP) receives current from another current source ($S_2$). The pulses counted in the counter during the discharge occurring in the initial step of the process have a greater weight than the impulses counted in subsequent steps. To this end, the pulses are added directly to counting stages of higher significance.

An analog digital conversion system employing the concept of first coarsely coding a measured value of voltage corresponding to the amplitude of an analog input signal with the aid of a rapid build-up or slope velocity of a time-linearly increasing voltage and then proceeding with a fine coding operation in subsequent steps by means of lower slope velocities. In the first processing step, coarse coding is effected by measuring the number of stroke or timing pulses which are assigned a predetermined weighting factor and which are fed to a bidirectional counter during a first time interval. The weighting factor assigned the timing pulses in the first processing step is greater than that assigned in the second subsequent processing step during a second time interval in which the direction of change or variation of the time-linearly varying voltage is reversed. During the second processing step, the linearly varying voltage changes by an amount corresponding to the amount by which the measurable voltage was exceeded or overshot in the first processing step. To this end, the timing pulses fed to the counter during the second time interval are assigned the lower weighting factor and counted in the backward direction with the rate of variation of the linearly varying voltage being smaller than in the first processing step in proportion to the weighting factor assigned.

9 Claims, 2 Drawing Figures

Inventor
Abutorab Bayati
by:
Edwin E. Greigg

METHOD AND APPARATUS FOR ANALOG-DIGITAL CONVERSION

This application is a Continuation application of Ser. No. 730,067, filed May 17, 1968 now abandoned Analog-digital conversion, with a time interval as the intermediate quantity according to which the voltage to be measured is compared with a time-linearly rising voltage or sawtooth voltage, is well known in the art. Following a starting pulse which represents the beginning of the time interval, the sawtooth voltage begins to increase. As soon as the sawtooth voltage has attained the measured voltage i.e. as soon as the amplitude of the sawtooth voltage corresponds to the amplitude of the measured or input voltage, a voltage comparing means emits at its output a pulse marking the end of the time interval. The time interval is measured by counting stroke or timing pulses which travel from a constantly running pulse generator to a counting means only during the time interval.

Such methods for the analog-digital conversion may be used also for analyzing the pulse amplitude. For this particular purpose, a storage device can be charged with the input pulse up to the peak pulse voltage and can then be discharged time-linearly, or the storage voltage can be compared with a time-linearly rising voltage. The number of the stroke or timing pulses having passed or traveled into the counter is then an indication or measure for the pulse amplitude. To each number there may be assigned a channel. The build-up velocity of the sawtooth voltage and the time interval between two stroke or timing pulses determine the width of the channel. Such methods have the advantage that a particularly constant and uniform channel width may be achieved. Their disadvantage, however, consists in that the measured intervals, the so-called coding times, are longer than in other methods.

It is an object of this invention to propose a method for the analog-digital conversion according to which the coding time or measured interval is shortened as compared to the normal sawtooth voltage method, while the accuracy and, respectively, the constancy and uniformity of the channel widths during the pulse amplitude analysis are not impaired. In achieving this object, this invention utilizes the concept of first coarse coding of the amplitude of a measured value or input signal with the aid of a rapid build-up or slope velocity of a time-linearly increasing voltage and then proceeding with and carrying out a fine coding operation in subsequent steps by means of lower slope velocities.

Accordingly, the present invention is directed to a method and apparatus for the analog-digital conversion in which stroke or cadence pulses are fed to a counter during the time in which a voltage which changes linearly with respect to the time varies in magnitude by an amount corresponding to a measured voltage. The measured voltage corresponds to the amplitude of an incoming pulse signal. Thus, in a first process step, the stroke or timing pulses are assigned or given a greater weight in that the linearly varying voltage changes to an extent more than the measured voltage during an integer number of stroke or timing pulse intervals, and in a following process step the direction of the change of the variable voltage is reversed, and further, that during the time within which the voltage changes by the amount by which the measuring voltage was exceeded in the preceding process step, the stroke or timing pulses are assigned or given a lower weight and counted in the backward direction, the rate of the variation of the varying voltage being smaller than in the preceding process step in proportion to the weight assigned.

Two or more process steps may be employed. When the measured value is coded in two process steps, a particularly short coding time is attained if, in the first process step, the weight factor is chosen to be equal to the square root of the greatest number present in the counter. In this case, the coding time becomes shorter by the factor $\sqrt{N}/2$ than in a normal sawtooth voltage coder device, the number N being the highest number present in the counter. For example, if a pulse amplitude analyzer has 1024 channels, this factor will be 16. With a pulse repetition frequency of 5 MHz, the longest coding time is 12.8 $\mu$sec. In the case of this invention, however, the coding time does not vary linearly with the analog input value in contrast to a conventional sawtooth voltage coder.

The stroke or timing pulses are advantageously assigned or given greater weight by applying them during preceding process steps to higher locations of the counter corresponding to the greater weights than during subsequent process steps. For example, if the coding operation is carried out in two process steps or stages and a binary counter is used therefor, the stroke or timing pulses are fed preferably to a mean or central stage of the counter. In the case of a 10-stage counter, the fifth stage is selected, and in an 11-stage counter, the fifth or sixth stages. Utilized as a counter in this invention is a forward-backward or reversible type of counter to which the stroke or timing pulses are fed during the first process step by means of a forward input and, in the course of subsequent process steps via a backward input so that they are fed, alternately by means of backward and forward inputs, respectively, having in the case of each succeeding step lower positional values.

If the analog-digital converter proposed by this invention is employed for the digital measurement of pulse amplitudes, a storage device may be provided which is charged to the peak voltage of the input signal and is then discharged in at least two process steps. It is also quite readily possible, of course, to leave the storage device in th charged condition and to compare the voltage thereof with the varying voltage. This involves the difficulty, however, that for purposes of avoiding measurement inaccuracies, the storage device should not be discharged during the measuring interval. In the preferred embodiment, the procedure is carried out in such a manner that the varying voltage, for example the storage device voltage which varies linearly with respect to time by reason of its discharge, or a sawtooth voltage, is compared to a known or specific voltage, for example to zero potential as the case may be to the measuring voltage, and that when this voltage is either overshot or undershot as the case may be, switches are then operated which will block the input of the counter which is ready for operation, convert the direction of variation of the varying voltage and the rate of change of the varying voltage to a corresponding value, and then open the input of the counter with the correspondingly low significance.

Further advantages as well as additional features of the present invention will ow be described and explained in detail in one embodiment of a device for the digital measurement of pulse amplitudes, taken in connection with the accompanying drawings, wherein.

Figure 1:
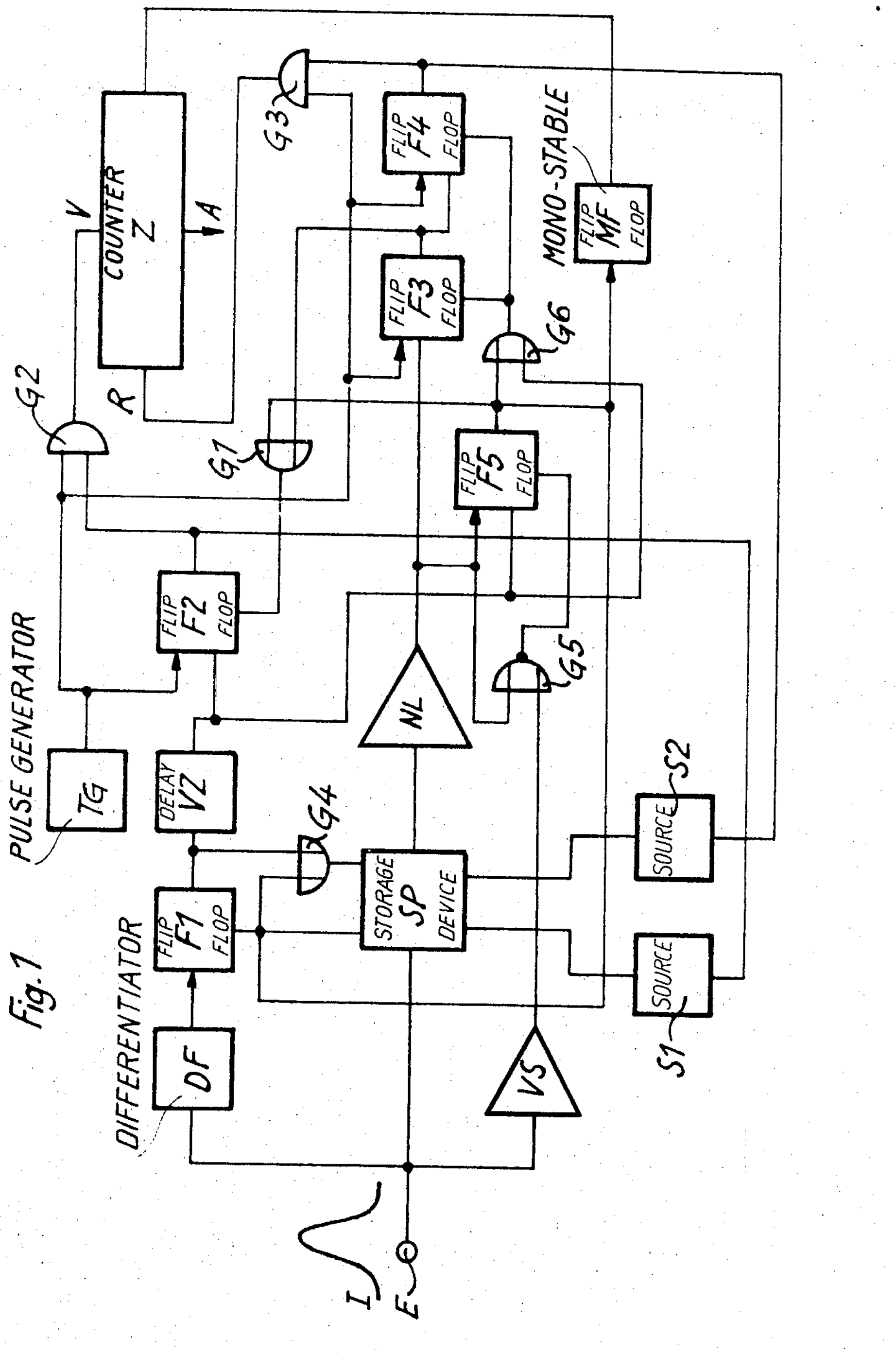
FIG. 1 is a block diagram of a device as proposed by the present invention.
Figure 2:
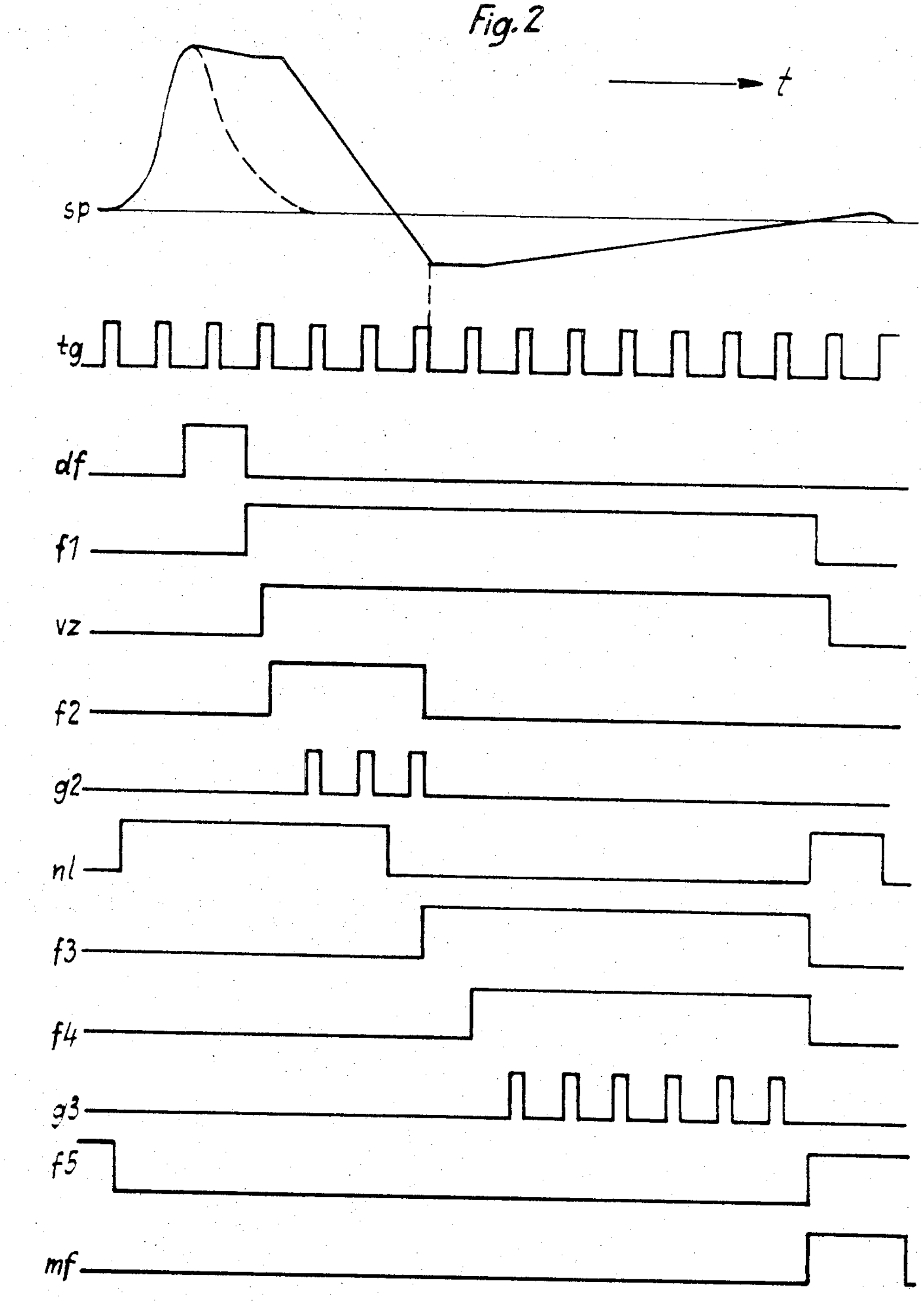
FIG. 2 illustrates the operation of the wiring or switching arrangement according to FIG. 1 on the basis of pulse diagrams.

A pulse I which is fed to the input E of the analog-digital converter charges a storage device SP to the peak pulse voltage. The storage device SP retains this charge for a specific period of time, as is apparent from the graph *sp* in FIG. 2. The individual pulse diagrams in FIG. 2 have been identified with the same symbols as the corresponding stages of FIG. 1, but in small letters. The pulse I is further fed or conveyed to a differentiator DF by which the maximum value of the pulse is determined chronologically. The differentiator DF furnishes a pulse whose duration is constant and slightly longer than the interval between two stroke or timing pulses to be discussed below. The forward slope of this pulse coincides chronologically with the maximum value of the measured or input pulse I. A bistable sweep or flip-flop stage $F_1$ is triggered by the backward or rear slope of this pulse. The output of stage $F_1$ is connected through an OR gate $G_4$ to an input of the pulse storage device SP by means of which the latter may be blocked from further measured or input pulses I. The connection in series with the differentiator DF ahead of the flip-flop stage $F_1$ is a particularly suitable arrangement. On the other hand, the differentiating stage DF may also be omitted, particularly in the case where it is not the pulse amplitudes but the constant measured voltages which are coded.

With the output pulse of the flip-flop stage $F_1$ a bistable flip-flop stage $F_2$ is triggered. A delay device VZ is advantageously connected between these two flip-flop stages. The flip-flop stage $F_2$ is triggered after setting by the backward or rear slope of a stroke or timing pulse which is supplied by a pulse generator TG.

From then on, the measuring procedure or operation takes place in synchronism with the stroke or timing pulses. Stage $F_2$ connects a current source $S_1$ to the storage device SP so that the latter is discharged with a constant current. The delay device VZ assures that the discharge will occur only when the storage device is blocked from further input pulses by the flip-flop stage $F_1$.

Until the discharge begins, the output voltage of the storage SP is unvaried by means of its storage capacitor, not shown. As a result of unavoidable parallel or shunt resistances with respect to this capacitor, the output voltage of the storage device SP will slowly decrease once this maximum value which corresponds to the peak value of the input pulse I has been reached. The voltage decrease during the time after reaching the maximum value up to the conversion of the flip-flop stage $F_1$ produces no error because this time period is constant for all input pulses due to the constant duration of the output pulses of the differentiator DF. According to the law governing the discharge of a capacitor, the ratio of the voltage decrease of the storage device SP to the peak values having been stored by the measured or input pulses I remains constant during this time. For the same reason, the delaying time of the delay device VZ similarly has no influence upon the measured result. On the other hand, the period of time which elapses from the appearance of the starting pulse of the delay device to the conversion of the flip-flop stage $F_2$ is not constant since the measured or input pulses have no chronological relation to the stroke or timing pulses. This time varies by the temporal distance between two stroke or timing pulses. If two input pulses having the same pulse amplitude, one of which arrives at the input of the analog-digital converter shortly ahead of the rear slope of a stroke or timing pulse and the other shortly behind it, are intended to effect the same digital quantity after coding at the output of the analog-digital converter, then the output voltage of the storage device SP must remain constant within the period of time between two stroke or timing pulses. For example, if a pulse amplitude analyzer has 1024 channels and if the channel widths must not vary by more than 1 percent with respect to each other, the output voltage of the storage device SP must remain constant within the interval between two stroke or timing pulses to $10^{-5}$ of the highest measuring pulse. As seen from the graph *sp* in FIG. 2, this requirement is met by the fact that, with the output pulse of the flip-flop stage $F_1$, not only the storage device SP is blocked from further input pulses, but that care is taken to insure that the time constant of the storage capacitor circuit is extremely great after the appearance of the forward slope of the output pulse of the flip-flop stage $F_1$.

Simultaneously with the appearance of the output pulse of the flip-flop stage $F_2$, the current source $S_1$ is connected to the storage device SP and the AND gate $G_2$ is freed so that the pulses from the pulse generator TG, having a constant repetition rate, pass through the AND gate $G_2$ to the input V of a counter Z. In the embodiment illustrated, the counter Z, which is a forward-backward counter, has two counting inputs. Pulses being conveyed through the input V are added in the counter, and pulses being fed through the input R are subtracted from the number already stored within the counter. The stroke or timing pulses being fed through the input V have, however, a weight factor different from those being conveyed through the input R. If the greatest number stored in the counter is N, the weight factor during counting through the input V is greater by the factor $\sqrt{N}$ than that occurring when counting through the input R. For a binary counter, this means that the input V must be connected to a mean or central stage of the counter. Thus, stage $F_2$ brings into use that input of the counter Z which gives to the timing pulses a weight factor greater than that of the pulses applied at R.

The forward counting with the higher weight factor, which has begun after the conversion of the flip-flop stage $F_2$, is continued until the output voltage of the storage device SP has reached a negative value. It should be understood that the output voltage from the storage device will decrease linearly due to the discharge of the storage capacitor thereof with the constant current from the current source $S_1$. Also, it should be understood that, during the passage through zero of the voltage at the storage capacitor, a flip-flop stage $F_3$ is converted after setting by the rear slope of the next-following stroke or timing pulse. With the output pulse of this third flip-flop stage $F_3$, the second flip-flop stage $F_2$ is reset by way of an OR gate $G_1$ so that the AND gate $G_2$ is blocked and the discharge current of the storage device SP is cut off. According to the graph *g2* in FIG.2, the number of pulses having been counted in is 3, and this number multiplied by the weight factor is present in the counter. This number is, however, too great; the correct value is between 2 and 3, multiplied in each case by the weight factor. The counter or meter indication must therefore be lowered by counting backwards, at which time the stroke or timing pulses are assigned a lower weighting factor.

After cutting off the current source $S_1$, a constant negative voltage is present at the output of the storage device SP. This voltage is an indication for a number by which the contents of the counter must be lowered. A second process step is now necessary.

With the conversion of the third flip-flop stage $F_3$, not only the second flip-flop stage $F_2$ is reset but also a fourth flip-flop stage $F_4$ is set. With the rear slope of the first stroke pulse after setting, the flip-flop stage $F_4$ is converted and, as a result, the current source $S_2$ is connected to the storage device and stroke or timing pulses are then connected through to the input R of the counter through an AND gate $G_3$. The current from the current source $S_2$ recharges the storage capacitor in the reverse direction as compared to the current from the source $S_1$ and this current is smaller than the current from the source $S_1$ by the weight factor. The currents from the two sources $S_1$ and $S_2$ are compared with each other by means of a zero amplifier indicator and the difference is adjusted or balanced out in such a manner that any possible variations of the two current sources display the same tendency so that the ratio thereof remains equal at all times to the weight factor.

By way of the AND gate $G_3$ the contents of the counter are counted backwards by the stroke or timing pulses. This backward counting continues until the output voltage of the storage device SP is once again positive. The passage of the voltage through zero is determined by means of the zero amplifier or null indicator NL. In other arrangements in which the measured voltage is compared to a sawtooth voltage, and in which it is thus necessary to determine the equality of two voltages which are not zero, a differential amplifier is utilized instead of the zero amplifier.

As a result of the passage through zero of the voltage at the storage capacitor, a fifth bistable flip-flop stage $F_5$ is triggered by the front slope of the positive pulse furnished by the zero amplifier indicator NL. This fifth flip-flop stage is set by the output voltage of the delay device VZ and, with the front slope of its output pulse, resets the flip-flop stages $F_1$, $F_2$, $F_3$ and $F_4$, discharges the storage device, blocks the latter for further measuring pulses through the gate $G_4$ and provides the output of the measuring result. Due to the resetting of the flip-flop stage $F_4$, the AND gate $G_3$ is blocked to further counting pulses and the current source $S_2$ is cut off. An OR gate $G_6$ is suitably connected or interposed between the flip-flop stage $F_5$ and the flip-flop stages $F_3$ and $F_4$, and the other input of the gate $G_6$ is connected by the delay device VZ to the first flip-flop stage $F_1$. In the embodiment illustrated, the flip-flop stage $F_5$ controls a monostable flip-flop stage MF which is triggered by the output pulse of the flip-flop stage $F_5$ and provides the counting result as well as the erasing of the values of the counter. The coding operation for an input pulse I is then completed and the analog-digital converter is set for treatment or processing of the next-following pulse.

For the next-following input pulse, the flip-flop stage $F_5$ which retains the analog-digital converter through the gate $G_4$ in the blocked condition must first be reset. This is accomplished by means of the input pulse I, which is amplified by amplifier VS through a NOR gate $G_5$. The flip-flop stage $F_5$ must be reset before the measured pulse has reached the peak value thereof so that, after opening the storage device, there is enough time available for still charging the storage device to the peak value of the measured pulse.

That which is claimed is:

1. An apparatus for converting analog values to digital values comprising in combination, storage means for receiving an analog voltage, a first and a second current source arranged to be connected to said storage means and being operable upon connection thereof for charging and discharging said storage means, respectively, for producing a time-linearly variable voltage which changes by an amount corresponding to the amplitude of the analog voltage, the output currents of said first and said second source being proportional to the respective rates of change of said varaible voltage, counter means for counting timing pulses applied thereto, a pulse generator for generating said timing pulses, gate means connected between the output of said pulse generator and the input of said counter means for controllably feeding pulses from said pulse generator to said counter means, voltage comparing means for controlling said gate circuit, said voltage comparing means being connected to said storage means for comparing the voltage thereof to a reference voltage and being arranged to actuate said gate means for selectively connecting one of said first and said second sources to said storage means, a first bistable switching element connected to said storage means for blocking said storage means, a second bistable switching element, said first bistable switching element being arranged for controllably switching said second bistable switching element, means for connecting said first current source to said storage means and opening a first input to said counter means corresponding to the highest significance digit position assigned to said timing pulses upon switching of said second bistable element, and differentiator means connected in series with said first bistable switching element for furnishing a pulse to said first element beginning with the maximum value of said input analog voltage, the rear slope of said pulse from said differentiator triggering said first bistable switching element.

2. Apparatus according to claim 1, wherein said counter is a forward-backward or reversible counter, and said timing pulses are fed thereto through a forward input in response to one polarity of the output of said voltage comparing means and through a backward input in response to the other polarity thereof so as to control the direction of count of said counter.

3. Apparatus according to claim 1, including a delay means connected between said first bistable switching element and said second bistable switching element.

4. Apparatus according to claim 1, including a third bistable switching element connected to said voltage comparing means, said third element being controlled by said timing pulses and connected to said second element for resetting said second bistable switching element, a fourth bistable switching element connected to said third bistable switching element, said fourth element being controlled by said timing pulses, and an AND gate connected to said fourth bistable switching element, said AND gate being connected to receive said timing pulses whereby said fourth bistable switching element opens a second input to said counter means corresponding to the digit of lower significance for said timing pulses such that the pulses counted in by said counter are counted with a lesser weight than the pulses counted on opening of said first input.

5. Apparatus according to claim 4 wherein said voltage comparing means is a differential amplifier.

6. Apparatus according to claim 4, further including a fifth bistable switching element connected to said first bistable switching element and arranged to be set thereby, said voltage comparing means being connected to said fifth bistable switching element for controlling the latter to reset said other bistable switching elements and to discharge said storage means.

7. Apparatus according to claim 6, wherein said fifth bistable switching element is further connected to a monostable switching element, said monostable element being connected to said counter means and triggered by said fifth element for effecting a counting result within the duration of the output pulse thereof.

8. Apparatus according to claim 7, wherein said fifth bistable switching element is further connected to an amplifier, said analog input pulse being fed to said amplifier, a NOR gate having an output connected to said fifth element, the output of said amplifier being fed to an input of said NOR gate for resetting said fifth bistable switching element.

9. Apparatus according to claim 4, further including a fifth bistable switching element connected to said first bistable switching element and arranged to be set thereby, a delay means interconnected in series between said first and second bistable switching elements and further connected to said fifth bistable switching element for controlling the latter to reset said other bistable switching elements and discharge said storage means in accordance with the delay period of said delay means.

* * * * *